(12) United States Patent
Kobayashi et al.

(10) Patent No.: US 11,383,981 B2
(45) Date of Patent: Jul. 12, 2022

(54) ALUMINUM NITRIDE PLATE

(71) Applicant: NGK Insulators, Ltd., Nagoya (JP)

(72) Inventors: Yoshimasa Kobayashi, Nagoya (JP); Hiroharu Kobayashi, Kasugai-Shi (KR); Hiroyuki Shibata, Okazaki (JP)

(73) Assignee: NGK Insulators, Ltd., Nagoya (JP)

( * ) Notice: Subject to any disclaimer, the term of this patent is extended or adjusted under 35 U.S.C. 154(b) by 112 days.

(21) Appl. No.: 17/030,960

(22) Filed: Sep. 24, 2020

(65) Prior Publication Data
US 2021/0002138 A1    Jan. 7, 2021

Related U.S. Application Data

(63) Continuation of application No. PCT/JP2019/013227, filed on Mar. 27, 2019.

(30) Foreign Application Priority Data

Mar. 27, 2018  (WO) .................. PCT/JP2018/012542

(51) Int. Cl.
| | |
|---|---|
| *C01B 21/072* | (2006.01) |
| *H01L 21/02* | (2006.01) |
| *C30B 29/38* | (2006.01) |

(52) U.S. Cl.
CPC ........ *C01B 21/0722* (2013.01); *C01B 21/072* (2013.01); *C30B 29/38* (2013.01);
(Continued)

(58) Field of Classification Search
CPC .............. C01P 2006/80; C01P 2002/74; C01P 2002/78; C04B 2235/5292; C04B 35/581;
(Continued)

(56) References Cited

U.S. PATENT DOCUMENTS

| | | |
|---|---|---|
| 6,051,303 A | 4/2000 | Katsuda et al. |
| 2006/0163605 A1 | 7/2006 | Miyahara |
| (Continued) | | |

FOREIGN PATENT DOCUMENTS

| | | |
|---|---|---|
| JP | H08-157265 A1 | 6/1996 |
| JP | H11-054603 A1 | 2/1999 |
| (Continued) | | |

OTHER PUBLICATIONS

International Search Report and Written Opinion (Application No. PCT/JP2019/0132276) dated May 21, 2019.
(Continued)

*Primary Examiner* — Timothy C Vanoy
(74) *Attorney, Agent, or Firm* — Burr & Brown, PLLC

(57) ABSTRACT

An aluminum nitride plate satisfies a "c1>97.5%", a "c2>97.0%", a "w1<2.5 degrees", and a "w1/w2<0.995" where c1 is a c-plane degree of orientation that is defined as a ratio of a diffraction intensity of (002) plane when a surface layer of the aluminum nitride plate is subjected to an X-ray diffraction measurement, and c2 is a c-plane degree of orientation that is defined as a ratio of the diffraction intensity of (002) plane when a portion other than the surface layer of the aluminum nitride plate is subjected to the X-ray diffraction measurement, wherein w1 is a half-value width in an X-ray rocking curve profile of (102) plane of the surface layer and w2 is a half-value width in the X-ray rocking curve profile of (102) plane of the portion other than the surface layer.

2 Claims, 5 Drawing Sheets

(52) U.S. Cl.
CPC .. *H01L 21/02389* (2013.01); *H01L 21/02433* (2013.01); *C01P 2002/74* (2013.01); *C01P 2002/78* (2013.01); *C01P 2006/80* (2013.01)

(58) Field of Classification Search
CPC ......... H01L 21/02433; H01L 21/02389; C30B 29/403; C30B 29/38; C30B 33/06; C01B 21/072; C01B 21/0722
See application file for complete search history.

(56) References Cited

U.S. PATENT DOCUMENTS

| | | |
|---|---|---|
| 2006/0183625 A1 | 8/2006 | Miyahara |
| 2013/0187170 A1 | 7/2013 | Fukuyama et al. |
| 2015/0194493 A1 | 7/2015 | Sakaguchi et al. |

FOREIGN PATENT DOCUMENTS

| | | | | |
|---|---|---|---|---|
| JP | 2006 290 729 A | * | 10/2006 | ............. C30B 29/38 |
| JP | 2011-020900 A1 | | 2/2011 | |
| JP | 2012-031027 A1 | | 2/2012 | |
| JP | 2015-133354 A1 | | 7/2015 | |
| JP | 2016-520992 A1 | | 7/2016 | |
| JP | 2019 189378 A | * | 10/2020 | ......... C04B 35/6342 |
| WO | 2011/007762 A1 | | 1/2011 | |
| WO | 2012/008545 A1 | | 1/2012 | |
| WO | 2014/159954 A1 | | 10/2014 | |

OTHER PUBLICATIONS

Extended European Search Report (Application No. 19775036.7) dated Nov. 17, 2021.

* cited by examiner

FIG. 6

| Tape Raw Material | Plate-shaped Alumina | | | | Spherical Alumina | Plate-shaped/ Spherical | Firing Aid |
|---|---|---|---|---|---|---|---|
| | Particle Diameter (μm) | Thickness (μm) | Aspect Ratio | Used Amount (Mass%) | Used Amount (Mass%) | (Mass Ratio) | Used Amount (Mass%) |
| 1 | 7 | 0.1 | 70 | 36.24 | 58.96 | 0.7 | 4.8 |
| 2 | 5 | 0.07 | 70 | 42.31 | 52.89 | 0.8 | 4.8 |
| 3 | 5 | 0.07 | 70 | 47.6 | 47.6 | 1.0 | 4.8 |

FIG. 7

| | Surface Layer | | Lower Layer | | Degree of Orientation | | Twist Angle | | Translucency | Film Formability | Workability |
|---|---|---|---|---|---|---|---|---|---|---|---|
| | Material | Number of Laminated Layers | Used Tape | Number of Laminated Layers | Relation 1 | Relation 2 | Relation 3 | Relation 4 | | | |
| Specimen 1 | Aluminum Nitride Monocrystal | — | Tape 1 | 10 | ○ | ○ | ○ | ○ | ○ | ○ | ○ |
| Specimen 2 | Aluminum Nitride Monocrystal | — | Tape 2 | 10 | ○ | × | ○ | ○ | × | ○ | ○ |
| Specimen 3 | Aluminum Nitride Monocrystal | — | Aluminum Nitride Monocrystal | — | ○ | ○ | ○ | × | ○ | ○ | × |
| Specimen 4 | Tape 3 | 4 | Tape 1 | 10 | ○ | ○ | × | ○ | ○ | × | ○ |
| Specimen 5 | Tape 1 | 4 | Tape 1 | 10 | ○ | ○ | × | × | ○ | × | ○ |
| Specimen 6 | Tape 2 | 4 | Tape 2 | 10 | × | × | × | × | × | × | ○ |

ALUMINUM NITRIDE PLATE

TECHNICAL FIELD

The disclosure herein discloses a technique relating to an aluminum nitride plate.

BACKGROUND ART

An aluminum nitride plate is known as a substrate on which a semiconductor is to be grown. The aluminum nitride plate is used as a substrate on which a group-III nitride semiconductor is to be grown since it has a lattice constant close to that of group-III nitride semiconductor. Japanese Patent Application Publication No. 2011-20900 (which will hereinafter be termed Patent Literature 1) describes an aluminum nitride plate (aluminum nitride laminated plate) where only the surface layer is monocrystalline and a portion other than the surface layer is polycrystalline. Although recognizing that monocrystalline aluminum nitride is useful as a substrate on which a semiconductor is to be grown, Patent Literature 1 fabricates the laminated plate including monocrystal and polycrystal owing to a difficulty in stably manufacturing a freestanding monocrystalline aluminum nitride plate (monocrystalline aluminum nitride plate having a handleable thickness). Specifically, to suppress warpage or the like from occurring in aluminum nitride due to a difference in lattice constant between aluminum nitride and a substrate (substrate on which aluminum nitride is to be grown), Patent Literature 1 forms a thin monocrystalline aluminum nitride layer on the substrate and forms a polycrystalline aluminum nitride layer on a surface of the monocrystalline layer.

Patent Literature 1 configures the monocrystalline layer and the polycrystalline layer such that the aluminum nitride plate varies in nitrogen (N) ratio. Patent Literature 1 uses the monocrystalline layer as a surface on which a semiconductor is to be grown. Since the semiconductor is grown on the monocrystalline layer, formation (growth) of a high-quality semiconductor is expected.

SUMMARY OF INVENTION

Technical Problem

In some semiconductor devices, their aluminum nitride plates may not be removed in the manufacturing process and be allowed to remain in the finished products (semiconductor devices). As described above, in the aluminum nitride plate of Patent Literature 1, the nitride ratio is varied between the monocrystalline layer and the polycrystalline layer. Specifically, in Patent Literature 1, the monocrystalline layer has a nitrogen content of 34.15 to 34.70 mass %, and the polycrystalline layer has a nitrogen content of 32.50 to 34.00 mass %. In this case, property difference between the monocrystalline layer and the polycrystalline layer of the aluminum nitride plate may affect functions of the semiconductor device. Therefore, even though a good-quality semiconductor is formed on the surface of the aluminum nitride layer, the functions of the semiconductor device may not be improved or may even be decreased. The disclosure herein provides an aluminum nitride plate that is useful as a substrate on which a semiconductor is to be grown.

Solution to Technical Problem

An aluminum nitride plate herein disclosed may satisfy the following relations (1) to (4)

$$c1 > 97.5\%, \quad (1):$$

$$c2 > 97.0\%, \quad (2):$$

$$w1 < 2.5 \text{ degrees}, \quad (3):$$

$$w1/w2 < 0.995 \quad (4):$$

where $c1$ is a c-plane degree of orientation that is defined as a ratio of a diffraction intensity of (002) plane to a sum of the diffraction intensity of (002) plane and a diffraction intensity of (100) plane when a surface layer of the aluminum nitride plate is subjected to an X-ray diffraction measurement along a thickness direction of the surface layer, and $c2$ is a c-plane degree of orientation that is defined as a ratio of the diffraction intensity of (002) plane to the sum of the diffraction intensity of (002) plane and the diffraction intensity of (100) plane when a portion other than the surface layer of the aluminum nitride plate is subjected to the X-ray diffraction measurement along a thickness direction of the portion other than the surface layer, wherein $w1$ is a half-value width in an X-ray rocking curve profile of (102) plane of the surface layer of the aluminum nitride plate and $w2$ is a half-value width in the X-ray rocking curve profile of (102) plane of the portion other than the surface layer of the aluminum nitride plate.

The above-described aluminum nitride plate includes at least two layers, namely, the surface layer and the portion other than the surface layer (which will hereinafter be termed a lower layer). In the above-described aluminum nitride plate, the half-value width $w1$ in the X-ray rocking curve profile of (102) plane of the surface layer is less than 2.5 degrees. On the other hand, the half-value width $w2$ in the X-ray rocking curve profile of (102) plane of the portion other than the surface layer relative to the half-value width $w1$ of the surface layer is less than 99.5%. Here, the "half-value width in the X-ray rocking curve profile of (102) plane" indicates an angle by which a crystal B is rotated (twisted) about its c-axis relative to a crystal A which is a reference. The more uniform in the orientation (angle) about the c-axis crystals are, the smaller the half-value width is. In the following description, the "half-value width" may be termed a "twist angle".

It should be noted that the "surface layer" herein means a portion included in a layer located at one end of the aluminum nitride plate out of 10 layers obtained by splitting the aluminum nitride plate into 10 along its thickness direction, and the portion is exposed at a surface of the aluminum nitride plate on the one end side. For example, when the layer located at the one end of the aluminum nitride plate that had been split into 10 layers in the thickness direction is further split into 10 layers in its thickness direction and a difference in the c-plane degree of orientation or in the twist angle is found between one of the 10 layers that is exposed at the surface of the aluminum nitride plate and another of the 10 layers, the exposed layer is defined as the "surface layer". A ratio of the surface layer relative to the thickness of the aluminum nitride plate varies depending on the thickness of the aluminum nitride plate.

In the above-described aluminum nitride plate, the surface layer and the lower layer are both uniform in the c-axis orientation (having c-plane degrees of orientation exceeding 97.0%), and especially the surface layer has a high c-axis degree of orientation (c-plane degree of orientation exceeding 97.5%). With the surface layer and the lower layer (i.e., entirety in the thickness direction) having the c-plane degrees of orientation of 97% or more, the aluminum nitride plate has high translucency. The aluminum nitride plate thus can be used, for example, as a light-emitting portion of a light-emitting element such as an LED (as a substrate for a light-emitting element). Moreover, in the above-described aluminum nitride plate, the surface layer has a small twist angle (twist angle of less than 2.5 degrees), thus gaps between crystals configuring the surface layer are small. The surface layer having a c-plane degree of orientation exceeding 97.5% and the twist angle of less than 2.5 degrees enables a good-quality (less-defective) semiconductor to be grown on the surface of the aluminum nitride plate.

Further, in the above-described aluminum nitride plate, the twist angle w2 of the lower layer is larger than the twist angle w1 of the surface layer (the above relation (4)). Gaps are ensured between crystals in the lower layer, and this relieves stress imposed from the semiconductor (semiconductor element portion) onto the aluminum nitride plate during a manufacturing process of the semiconductor device or during use thereof. Even when the twist angle w2 of the lower layer is at the same level as the twist angle w1 of the surface layer, a good-quality semiconductor can be grown on the surface of the aluminum nitride plate. In this case, however, the aluminum nitride plate has decreased strength (decreased fracture toughness), thus when a force due to the difference in thermal expansion coefficient between the grown semiconductor and the aluminum nitride plate is applied to the aluminum nitride plate, for example, this may facilitate deterioration of the aluminum nitride plate. The above-described aluminum nitride plate, in which the twist angle w2 of the lower layer is larger than the twist angle w1 of the surface layer, has increased strength and improved durability.

In the above-described aluminum nitride plate, the difference in nitrogen content between the surface layer and the portion other than the surface layer may be less than 0.15% in weight ratio. This allows the surface layer and the lower layer to be substantially the same in chemical composition and also in crystalline morphology. Thus, distortion or the like between the surface layer and the lower layer due to the difference in lattice constant therebetween is suppressed, and it is also suppressed that the aluminum nitride plate adversely affects the semiconductor element portion, for example, applying a force like distortion to the semiconductor element portion.

BRIEF DESCRIPTION OF DRAWINGS

FIG. 6 shows materials used for fabricating aluminum nitride plates of embodiment; and FIG. 7 shows evaluation results of the aluminum nitride plates of embodiment.

DESCRIPTION OF EMBODIMENTS

Figure 1:
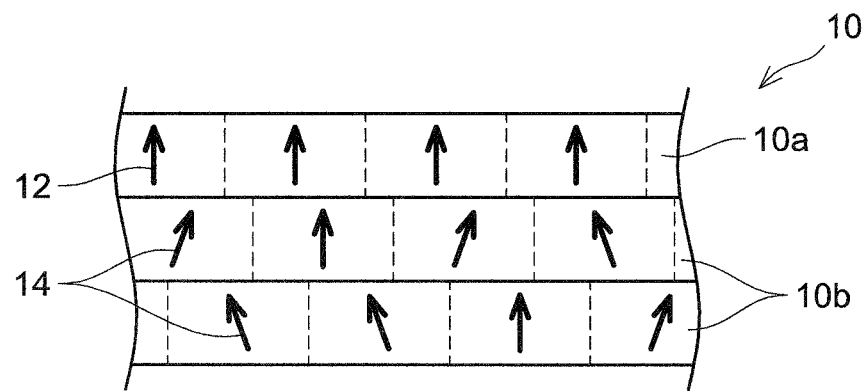
FIG. 1 shows a diagram for explaining characteristics of an aluminum nitride plate.

An embodiment of the technique disclosed herein will be described.

The disclosure herein discloses an aluminum nitride plate that is suitably used as a substrate on which a semiconductor, in particular, a group-III nitride semiconductor is to be grown. The aluminum nitride plate has high thermal conductivity and is suitably used as a substrate for a semiconductor device. The aluminum nitride plate disclosed herein has a flat plate shape and may have any outer shape such as, a rectangular shape or a circular shape. In a case where the aluminum nitride plate has a circular shape, a notch, an orientation flat, or the like may be formed thereon. Moreover, a thickness of the aluminum nitride plate may be 0.1 mm or more, 0.2 mm or more, 0.25 mm or more, 0.5 mm or more, 0.75 mm or more, or 1.0 mm or more, although not particularly limited thereto. The thickness being excessively small could cause damage or warpage in the aluminum nitride plate during transfer, and properties of the semiconductor device may be affected thereby. Moreover, the thickness of the aluminum nitride plate may be 10 mm or less, 5 mm or less, 3 mm or less, or 1 mm or less. The thickness being excessively large might cause application of a large force on a semiconductor element portion due to thermal expansion coefficient difference, or might hinder miniaturization of the semiconductor device.

The aluminum nitride plate may include at least a surface layer and a lower layer based on difference in c-plane degree of orientation or in half-value width (twist angle) in an X-ray rocking curve profile of (102) plane. The surface layer may be disposed on the lower layer (on a surface of the lower layer). The surface layer may include a front surface of the aluminum nitride plate (a surface on which a semiconductor is to be grown). A thickness of the surface layer may be 10 nm to 500 μm, although not particularly limited thereto. Although a ratio of the thickness of the surface layer relative to the thickness of the aluminum nitride plate varies depending on the thickness of the aluminum nitride plate, the thickness of the surface layer may be smaller than one-tenth of the thickness of the aluminum nitride plate. The lower layer may include a surface on which no semiconductor is grown (a rear surface of the aluminum nitride plate). In other words, the lower layer may be a portion other than the surface layer in the thickness direction of the aluminum nitride plate.

A c-plane degree of orientation c1 of the surface layer may be more than 97.5%, more than 98%, or more than 99%. Moreover, a c-plane degree of orientation c2 of the lower layer may be more than 97.0%, more than 97.5%, more than 98%, or more than 99%. The c-plane degree of orientation of the surface layer may be equal to the c-plane degree of orientation of the lower layer, or the c-plane degree of orientation c2 of the lower layer may be higher than the c-plane degree of orientation c1 of the surface layer. The smaller the c-axis tilt angle (inclined angle) of crystals (aluminum nitride crystals) is, the higher quality the resulting semiconductor has. Moreover, the smaller the c-axis tilt angle of crystals is, the higher translucency the aluminum nitride plate has, thus the aluminum nitride plate has improved translucency. Thus, the aluminum nitride plate may satisfy "relation 1: c1>97.5%" in terms of the c-plane degree of orientation c1 of the surface layer and may satisfy "relation 2: c1>97.0%" in terms of the c-plane degree of orientation c2 of the lower layer. In a case where the c-plane degree of orientation c1 of the surface layer is 97.5% or less, a high-quality semiconductor would be difficult to obtain and defects might be generated in a semiconductor layer, for example.

A twist angle w1 of the surface layer may be less than 2.5 degrees, less than 2.0 degrees, less than 1.5 degrees, or less than 1.0 degrees. The smaller the twist angle w1 of the surface layer is (the more uniform in orientation about the c-axis crystals are), the smaller gaps between the crystals are, which enables growth of a high-quality semiconductor. Thus, the aluminum nitride plate may satisfy "relation 3: w1<2.5 degrees" in terms of the twist angle w1 of the surface layer.

The twist angle w1 of the surface layer may be smaller than a twist angle w2 of the lower layer. In other words, the twist angle w2 of the lower layer may be larger than the twist angle w1 of the surface layer. The twist angle w1 of the surface layer relative to the twist angle w2 of the lower layer may be less than 99.5%. In other words, the twist angles w1, w2 may satisfy "relation 4: w1/w2<0.995". The larger the twist angle w2 of the lower layer is, the more gaps are ensured between the crystals, which enables the aluminum nitride plate to have improved fracture toughness and be less likely cracked. The twist angle w2 of the lower layer may be adjusted within a range that satisfies the above relation 4, depending on the purpose.

The aluminum nitride plate can have improved fracture toughness even though the twist angle w1 of the surface layer is large. As described above, however, the twist angle w1 of the surface layer is maintained small to achieve growth of a high-quality semiconductor. In the aluminum nitride plate disclosed herein, the twist angle w1 of the surface layer is maintained small and the twist angle w2 of the lower layer is set to be larger than that of the surface layer, to enable growth of a high-quality semiconductor and enhancement of fracture toughness of the aluminum nitride plate itself. In other words, the aluminum nitride plate may satisfy both of the above relations 3 and 4. Moreover, the aluminum nitride plate may satisfy all of the above relations 1 to 4 to more reliably grow a high-quality semiconductor with high translucency.

The c-plane degrees of orientation were measured by placing disk-shaped aluminum nitride plate on a specimen holder with its surface layer or lower layer facing upward, and irradiating the aluminum nitride plate with X ray. In the measurement of the c-plane degrees of orientation, an XRD profile was measured in a range of 2θ=20 to 70° by an XRD device (D8-ADVANCE made by Bruker-AXS). Specifically, the measurement was conducted using CuKα ray under a condition that a voltage was 50 kV and a current was 300 mA. The c-plane degrees of orientation (%) were calculated from "I 002/(I 002+I 100)×100", where (I 002) is a diffraction intensity of (002) plane and (I 100) is a diffraction intensity of (100) plane. Moreover, to obtain an indication of c-plane twist angle, the surface layer of the disk-shaped aluminum nitride plate was subjected to a rocking curve measurement (XRC) of (102) plane. The rocking curve measurement was conducted using an XRD device of D8-DISCOVER made by Bruker-AXS under a measurement condition that a voltage was 40 kV, a current was 40 mA, a collimator diameter was 0.5 mm, an anti-scattering slit was 3 mm, an ω step width was 0.01 degrees, and a counting time was 1 second. This measurement was conducted with CuKα ray monochromatized and collimated (a half-value width of 28 seconds) by a Ge(022) asymmetric monochromator. Based on the resulting XRC profile, a half-value width was obtained.

The aluminum nitride plate disclosed herein has the above-described advantages because the c-plane degrees of orientation and the twist angles of the crystals configuring the surface layer and the lower layer are adjusted. In the aluminum nitride plate disclosed herein, each of the surface layer and the lower layer is a polycrystalline body formed of multiple microcrystals. The surface layer and the lower layer may be polycrystalline bodies fabricated using substantially the same raw material (particulates including aluminum nitride crystal grains). That is, the surface layer and the lower layer are different at least in the twist angle but may be the same in the crystal structure of the crystals per se. In other words, the surface layer and the lower layer may be substantially the same in the chemical composition. As a specific indication, a difference in nitrogen content between the surface layer and the portion other than the surface layer may be less than 0.15% in weight ratio. Configuring the surface layer and the lower layer to have substantially the same chemical composition enables the surface layer and the lower layer to have substantially the same properties (physical and chemical properties). This suppresses distortion between the surface layer and the lower layer due to a difference in lattice constant between the layers, for example. Thus, it is suppressed that the aluminum nitride plate adversely affects a semiconductor element portion.

As mentioned above, the lower layer of the aluminum nitride plate disclosed herein can be fabricated by firing aluminum nitride powder. Specifically, the lower layer of the aluminum nitride plate can be fabricated by: fabricating a flat plate-shaped compact using aluminum nitride particulates, each of which is in plate shape with an aspect ratio of 3 or more; and then sintering the compact by atmospheric sintering, hot pressing, hot isostatic pressing (HIP), spark plasma sintering (SPS), or the like. In the manufacturing of the lower layer of the aluminum nitride plate, a sintering aid that facilitates the sintering of the plate-shaped aluminum nitride particulates may be used. Moreover, the sintered lower layer of the aluminum nitride plate may further be fired to remove the sintering aid remaining in the aluminum nitride plate.

The surface layer of the aluminum nitride plate can be fabricated using aluminum nitride particulates, each of which is in plate shape with an aspect ratio of 3 or more. The aluminum nitride plate (the surface layer) can be fabricated by: firstly fabricating a flat plate-shaped compact using the plate-shaped aluminum nitride particulates with the aspect ratio of 3 or more by compacting them in a magnetically-oriented state, with tapes, or the like; and then sintering the compact by atmospheric sintering, hot pressing, hot isostatic pressing (HIP), spark plasma sintering (SPS), or the like. In the manufacturing of the surface layer of the aluminum nitride plate, a sintering aid that facilitates the sintering of the plate-shaped aluminum nitride particulates may be used. Moreover, the sintered surface layer of the aluminum nitride plate may further be fired to remove the sintering aid remaining in the aluminum nitride plate.

The aluminum nitride plate may be fabricated by bonding the surface layer and the lower layer. Specifically, flat plate-shaped fired bodies (fired surface layer and lower layer) are firstly prepared according to the above-described fabrication methods (step 1). Next, bonding surfaces of the fired bodies for the surface layer and the lower layer are irradiated with Ar neutral atom beam in a vacuum (step 2). Then, the beam-irradiated surface (bonding surface) of the fired body for the surface layer is brought into contact with the beam-irradiated surface (bonding surface) of the fired body for the lower layer, and the fired bodies are put under pressure to bond them (step 3). As described above, "Ar neutral atom beam" is used in step (2). For example, using Ar ion beam is not preferable because a material of the vacuum chamber (e.g., Fe, Cr, etc.) could mix in the bonding surfaces or an amorphous layer could fail to have a three-layer structure. Moreover, the pressure used in step (3) may be set as appropriate considering the size of the aluminum nitride plate (the sizes of the fired bodies for the surface layer and the lower layer), or the like. After the bonding of the fired bodies for the surface layer and the lower layer, the surface layer and the lower layer are polished to have predetermined thicknesses, as a result of which the aluminum nitride plate with a predetermined thickness can be fabricated.

Each of the plate-shaped aluminum nitride particulates is considerably small in size as compared with the aluminum nitride plate. For example, each of the aluminum nitride particulates may have a plane-direction length (c-plane size) L of 0.6 to 20 μm. If the plane-direction length L is excessively small, the particulates would aggregate, which makes it difficult to increase the c-plane degree of orientation of the crystals in the particulates. In contrast, if the plane-direction length L is excessively large, sintering would be difficult in the manufacturing of the aluminum nitride plate, which decreases a density of the aluminum nitride plate (relative density to theoretical density). Moreover, each of the aluminum nitride particulates may have a thickness-direction length D of 0.05 to 2 μm. If the thickness-direction length D is excessively small, the aluminum nitride particulates would likely to lose their shapes in the manufacturing of the aluminum nitride plate, which likely forms gaps between the crystals configuring the aluminum nitride plate, makes it difficult to decrease the twist angle of the aluminum nitride plate (the surface layer, in particular), and makes it difficult to increase the c-plane degree of orientation of the aluminum nitride plate. In contrast, if the thickness-direction length D is excessively large, in adjustment of the thickness of pre-firing compact by a doctor blade or the like, the aluminum nitride particulates receive the shearing stress imposed from the doctor blade onto the aluminum nitride particulates mainly on their lateral surfaces (surfaces parallel to the thickness direction), which could disarrange the alignment of the aluminum nitride particulates. Consequently, the twist angle of the aluminum nitride plate would be difficult to decrease and the c-plane degree of orientation of the aluminum nitride plate would be difficult to increase.

With reference to FIGS. 1 to 5, features of the aluminum nitride plate disclosed herein will be described. FIG. 1 schematically shows a cross section of an aluminum nitride plate 10. Arrows 12, 14 in the drawings each indicate a c-axis orientation. The aluminum nitride plate 10 includes a surface layer 10a having a high c-axis degree of orientation (c-plane degree of orientation) and a lower layer 10b having a lower c-axis degree of orientation than the surface layer 10a. The c-plane degrees of orientation of the surface layer 10a and the lower layer 10b satisfy the above-described relations 1 and 2. In other words, both of the surface layer 10a and the lower layer 10b have c-plane degrees of orientation more than 97% (more than 97.5% in the surface layer 10a). Moreover, a twist angle of the surface layer 10a is smaller than a twist angle of the lower layer 10b, and is less than 2.5 degrees. A semiconductor (not shown) is to be grown on a surface of the surface layer 10a.

The aluminum nitride plate 10 is fabricated using the above-described plate-shaped aluminum nitride particulates. The surface layer 10a and the lower layer 10b are fabricated from substantially the same raw material (plate-shaped aluminum nitride particulates) and are almost the same in the chemical composition. With regard to nitrogen element contents in the surface layer 10a and the lower layer 10b, for example, they are approximately equal, and specifically, a difference therebetween is less than 0.15 wt %. Thus, the surface layer 10a and the lower layer 10b are also substantially the same in properties. Dashed lines partitioning the surface layer 10a and the lower layer 10b in FIG. 1 indicate that the surface layer 10a and the lower layer 10b are configured of the plate-shaped aluminum nitride particulates that had undergone grain growth by sintering and does not necessarily indicate grain boundaries.

Raw materials of sheets (surface layer sheet, lower layer sheet) for fabricating the aluminum nitride plate 10 are slurry and can be generated by: producing a mixture of plate-shaped aluminum nitride particles and a firing aid such as calcium carbonate, yttria, and/or a Ca—Al—O-based aid; and adding a binder, a plasticizer, a disperser, and the like to the mixture. If needed, granular (spherical) aluminum nitride particles may be added to the slurry raw materials. The plate-shaped aluminum nitride particles used here each have a high aspect ratio (an aspect ratio of 3 or more).

Figure 2:
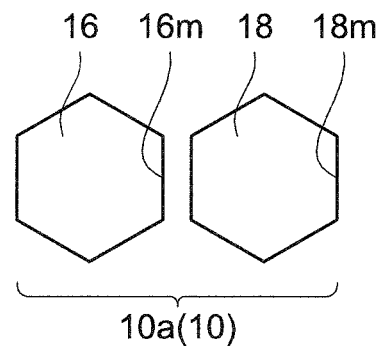
FIG. 2 shows a diagram for explaining characteristics of crystals that configure a surface layer.

FIG. 2 schematically shows aluminum nitride crystals 16, 18 that configure the surface layer 10a. FIG. 2 shows c-planes of the aluminum nitride crystals 16, 18. Aluminum nitride crystals have a hexagonal crystal structure and their m-planes are orthogonal to the c-axe. FIG. 2 shows an m-plane 16m of the aluminum nitride crystal 16 and an m-plane 18m of the aluminum nitride crystal 18. In the aluminum nitride plate 10, the aluminum nitride crystals configuring the surface layer 10a are uniform in the orientation about the c-axis and have a twist angle of less than 2.5 degrees. With regard to the m-planes 16m and 18m of the aluminum nitride crystals 16 and 18, the m-plane 16m and the m-plane 18m are substantially parallel to each other. As described above, the twist angle is shown in an X-ray rocking curve profile of (102) plane of aluminum nitride crystals in the surface layer 10a.

Figure 3:
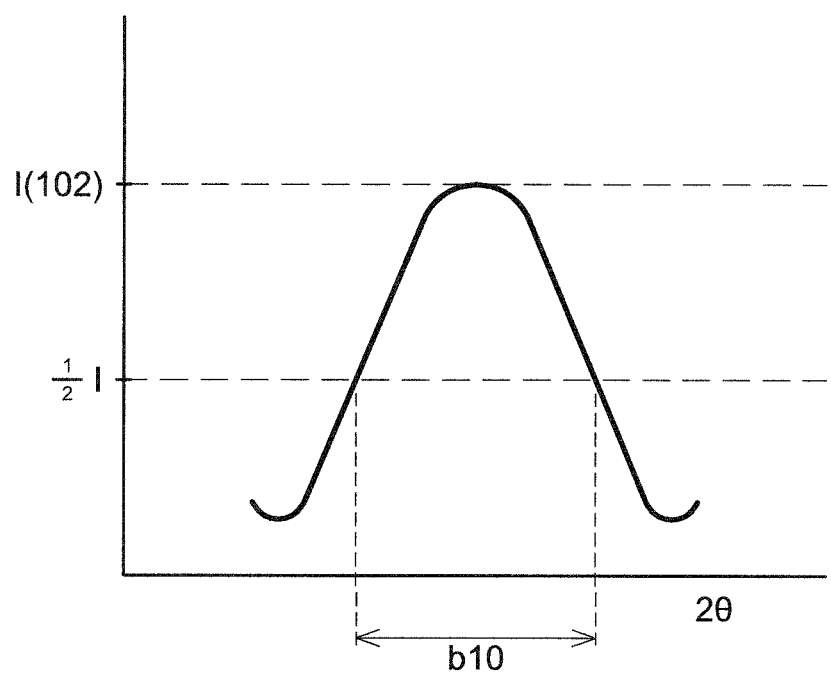
FIG. 3 shows an X-ray diffraction peak of the aluminum nitride crystal.

FIG. 3 shows a peak (highest peak) of the (102) plane of aluminum nitride crystals. Whether or not the aluminum nitride crystals in the surface layer 10a or the lower layer 10b are uniform in the orientation about the c-axis can be determined from a half-value width in the X-ray rocking curve profile of (102) plane, which is obtained by measuring the layer by an XRD device. In the aluminum nitride plate 10, a half-value width b10 of (102) plane in the surface layer 10a (corresponding to a twist angle w1) is 2.5 degrees or less. Further, a half-value width b10 of (102) plane in the lower layer 10b (corresponding to a twist angle w2) is larger than the twist angle of the surface layer 10a and satisfies the above relation 4. In other words, the aluminum nitride crystals in the surface layer 10a are highly uniform in the orientation about the c-axis, and the aluminum nitride crystals in the lower layer 10b are less uniform in the orientation about the c-axis as compared with the surface layer 10a. In the aluminum nitride plate 10, the surface layer 10a plays a role in allowing a high-quality semiconductor to be grown thereon, and the lower layer 10b plays a role in relieving a force applied from a semiconductor element portion onto the aluminum nitride plate 10.

Figure 4:
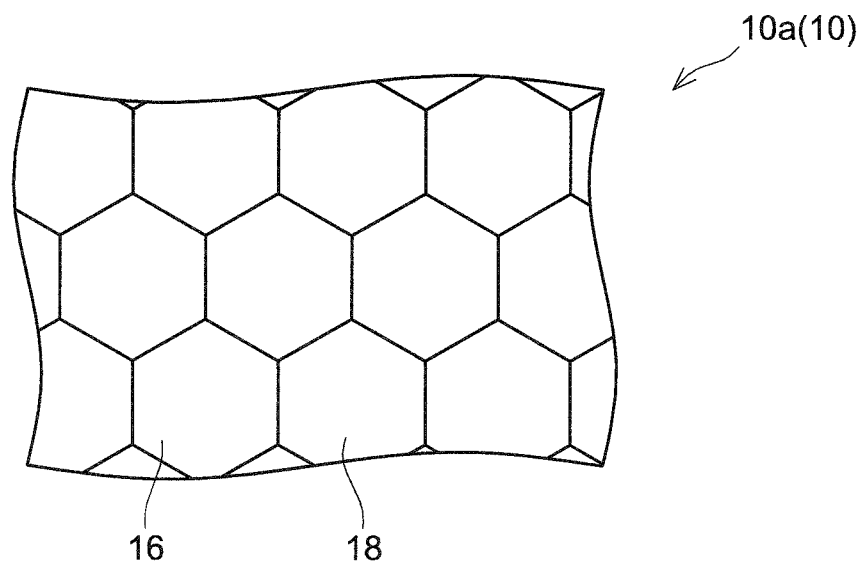
FIG. 4 shows a state of the crystals that configure the surface layer.
Figure 5:
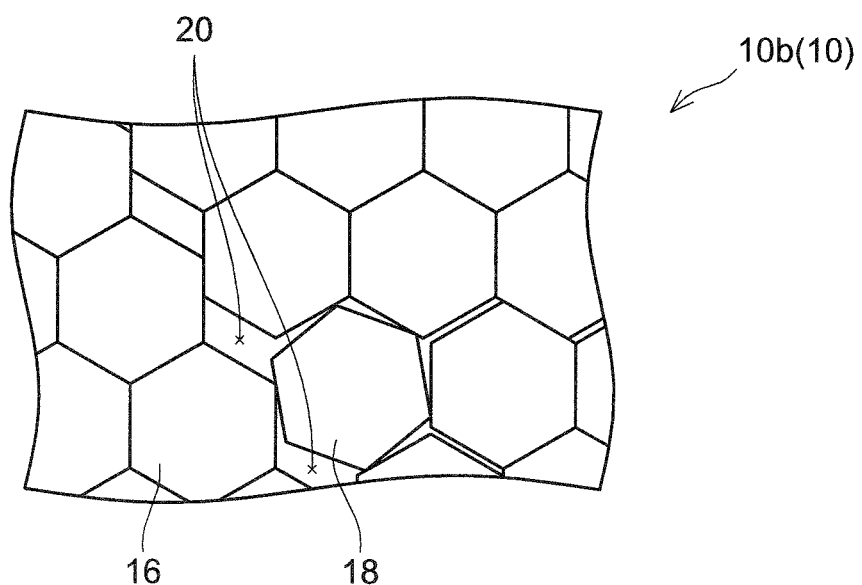
FIG. 5 shows a state of crystals that configure a lower layer.

FIG. 4 schematically shows a state of the surface layer 10a, and FIG. 5 schematically shows a state of the lower layer 10b. The aluminum nitride crystals uniform in the orientation about the c-axis as shown in FIG. 4 enables uniform crystal orientation in a semiconductor grown on the aluminum nitride crystals, so that the semiconductor has good quality (a few defects). On the other hand, the aluminum nitride crystals non-uniform in the orientation about the c-axis as shown in FIG. 5, for example, with the aluminum nitride crystal 18 rotated (twisted) relative to the aluminum nitride crystal 16, results in gaps 20 between the crystals 16 and 18. The gaps 20 relieves stress imposed from a semiconductor (semiconductor element portion) onto the aluminum nitride plate 10 during a manufacturing process of the semiconductor or during use thereof.

EXAMPLES

A plurality of aluminum nitride plates was fabricated and evaluated in terms of their properties. The results will hereinafter be described. It should be noted that examples shown below are intended merely for describing the disclosure herein, but not for limiting the disclosure herein.

Firstly, a method of producing plate-shaped aluminum nitride particles, which are a raw material of the aluminum nitride plates, will be described. The plate-shaped aluminum nitride particles were manufactured by heat-treating plate-shaped aluminum oxide in a furnace with nitrogen flow. Specifically, 100 g of plate-shaped aluminum oxide (KINSEI MATEC CO., LTD.), 50 g of carbon black (Mitsubishi Chemical Corporation), 1000 g of alumina balls ($\varphi$2 mm), and 350 mL of isopropyl alcohol (IPA) (Tokso IPA made by Tokuyama Corporation) were pulverized and mixed at 30 rpm for 240 minutes to obtain the mixture thereof. The plate-shaped aluminum oxide used here had mean particle diameters (plane-direction lengths) of 5 μm and 7 μm. The aluminum oxide with mean particle diameter of 5 μm had a mean thickness (thickness-direction length) of 0.07 μm and an aspect ratio of 70. The aluminum oxide with mean particle diameter of 7 μm had a mean thickness (thickness-direction length) of 0.1 μm and an aspect ratio of 70.

The alumina balls were removed from the obtained mixture, and then the mixture was dried by a rotary evaporator. The remaining mixture (the mixture of plate-shaped alumina and carbon) was then lightly disintegrated in a mortar (the is, the aggregated particles were separated with a relatively small force). Next, 100 g of the mixture was put into a carbon crucible. The carbon crucible was then placed in a furnace, heated to 1600° C. at a temperature increase rate of 200° C./hour with a nitrogen gas flow at 3 L/min, and then kept at 1600° C. for 20 hours. After the completion of heating, the carbon crucible was naturally cooled and the specimen was taken out from the crucible. The specimen was then subjected to heat treatment (post heat treatment) in a muffle furnace under an oxidizing atmosphere at 650° C. for 10 hours to obtain plate-shaped aluminum nitride particles. The post heat treatment was conducted to remove carbon remaining in the specimen.

Next, the resulting plate-shaped aluminum nitride particles were sorted for obtaining particles used as the raw material of the aluminum nitride plates. The aluminum nitride particles after the above-described heat treatment include single particles and aggregated particles. Thus, the aluminum nitride particles after the heat treatment were disintegrated and classified to sort out the single particles. Specifically, 100 g of the aluminum nitride particles after the heat treatment, 300 g of alumina balls ($\varphi$2 mm), and 60 mL of IPA (Tokso IPA made by Tokuyama Corporation) were put together and disintegrated at 30 rpm for 240 minutes. The alumina balls were then removed, and the mixture was dried by a rotary evaporator. Next, the dried aluminum nitride particles were classified by a precision air classifier (TC-15NSC made by Nisshin Engineering Inc.). Here, the classification diameters were set to be the same sizes as the mean particle diameters of the above-described plate-shaped aluminum oxide. The classified fine particles were used as the raw material of the aluminum nitride plates.

Next, a method of synthesizing a sintering aid used in manufacturing of the aluminum nitride plates will be described. A composite oxide of Ca and Al (Ca—Al—O-based aid) was manufactured as the sintering aid. Specifically, 56 g of calcium carbonate (Shilver-W made by Shiraishi Group), 19 g of γ-alumina (TM-300D made by TAIMEI CHEMICALS Co., Ltd.), 1000 g of alumina balls ($\varphi$15 mm), and 125 mL of IPA (Tokso IPA made by Tokuyama Corporation) were pulverized and mixed at 110 rpm for 120 minutes to obtain the mixture thereof. The alumina balls were removed from the obtained mixture, and then the mixture was dried by a rotary evaporator to obtain mixed powder. Then 70 g of the mixed powder was put into an alumina crucible. The alumina crucible was placed in a furnace, heated to 1250° C. at a temperature increase rate of 200° C./hour in the atmosphere, and then kept at 1250° C. for 3 hours. After the completion of heating, the crucible was naturally cooled, and the product (sintering aid) was taken out from the crucible. The mole ratio of Ca to Al in the obtained sintering aid was "Ca:Al=3:1".

Next, preparation of raw materials for tape bodies will be described. Three types of raw materials (tape raw materials 1 to 3) were fabricated by adjusting ratios (mass ratios) of the above-described plate-shaped aluminum nitride particles, the above-described sintering aid, and commercially-available aluminum nitride particles (F-GRADE made by Tokuyama Corporation, a mean particle diameter of 1.2 μm). FIG. 6 shows details of the tape raw materials 1 to 3. Specifically, 300 g of alumina balls ($\varphi$15 mm) and 60 mL of IPA (Tokso IPA made by Tokuyama Corporation) were added to 20 g (total weight) of each tape raw material, and the mixture was pulverized and mixed at 30 rpm for 240 minutes. The alumina balls were then removed and the resultant was dried by a rotary evaporator to fabricate the tape raw materials 1 to 3.

The tape raw materials 1 to 3 were used to fabricate three types of tape bodies. Specifically, 7.8 parts by mass of polyvinyl butyral (item No. BM-2 made by SEKISUI CHEMICAL CO., LTD.) as a binder, 3.9 parts by mass of di(2-ethylhexyl)phthalate (made by KUROGANE KASEI Co., Ltd.) as a plasticizer, 2 parts by mass of sorbitan trioleate (Rheodol SP-O30 made by Kao Corporation) as a disperser, and 2-ethylhexanol as a dispersion medium were added to 100 parts by mass of each tape raw material described above and mixed to fabricate raw material slurries. The added amount of the dispersion medium was adjusted such that the slurries had a viscosity of 20000 cP. The adjusted raw material slurries were applied respectively on PET films by a doctor blade method such that plate surfaces (c-planes) of the aluminum nitride particles were aligned along surfaces of tape bodies. Thicknesses of the slurries were adjusted to become 50 μm after drying. As above, the three types of tape bodies (tape bodies 1 to 3) were fabricated.

The tape bodies 1 to 3 were used to fabricate three types of aluminum nitride sintered bodies. These sintered bodies and a commercially-available aluminum nitride monocrystal (with a thickness of 350 μm) were used to fabricate six types of aluminum nitride plates (specimens 1 to 6). A method of fabricating the aluminum nitride sintered bodies will be described. Firstly, the tape bodies were cut into circles with diameter of 20 mm and the tape bodies were laminated to fabricate five types of laminated bodies. Specifically, the following five types of laminated bodies were fabricated a laminated body S1 in which four tape bodies 1 are laminated, a laminated body S2 in which four tape bodies 2 are laminated, a laminated body S3 in which four tape bodies 3 are laminated, a laminated body R1 in which ten tape bodies 1 are laminated, and a laminated body R2 in which ten tape bodies 2 are laminated. The laminated bodies were respectively placed on aluminum plates with a thickness of 10 mm and then packed in packages.

Then, the packages were evacuated to yield vacuum packages. The vacuum packages were subjected to isostatic pressing under a pressure of 100 kgf/cm² in warm water at 85° C. to obtain disk-shaped laminated bodies.

Next, the laminated bodies were subjected to primary firing. Specifically, the laminated bodies were firstly placed in a degreasing furnace and degreased at 600° C. for 10 hours, and then the degreased laminated bodies were fired, using a graphite mold, by hot pressing for 5 hours under a nitrogen atmosphere, a firing temperature (highest temperature) of 1850° C., and a surface pressure of 200 kgf/cm², for the primary firing of the laminated bodies. The pressure direction in the hot pressing was set to be the laminating direction of each laminated body (direction approximately orthogonal to the surface of the tape body). Moreover, the pressure was maintained until the temperature decreased to room temperature.

Next, the laminated bodies after the primary firing were subjected to secondary firing. Firstly, surfaces of the laminated bodies after the primary firing were ground such that the fired laminated bodies originated from S1, S2, and S3 had φ20 mm and a thickness of 0.08 mm, and the fired laminated bodies originated from R1 and R2 had φ20 mm and a thickness of 0.23 mm. These fired laminated bodies were put into an aluminum nitride sheath and fired in a furnace under a nitrogen atmosphere at a firing temperature (highest temperature) of 1900° C. for 75 hours, for the secondary firing of the laminated bodies.

Next, the laminated bodies after the secondary firing and the commercially-available aluminum nitride monocrystal were roughly polished on their front and rear surfaces. Then, they were fixed respectively onto metal surface plates of φ68 mm, polished by a copper lapping machine onto which drops of slurry containing diamond abrasive grains with particle diameters of 9 μm and 3 μm had been applied, and further polished for 300 minutes by a buffing machine onto which drops of slurry containing colloidal silica had been applied. Then, the polished laminated bodies and aluminum nitride monocrystal were cleaned with acetone, ethanol, and ion-exchanged water in this order for 3 minutes each. With respect to the polished laminated bodies and aluminum nitride monocrystal, S1, S2, and S3 each had a thickness of 60 μm, R1 and R2 each had a thickness of 210 μm, and their both surfaces were mirror-finished.

As substrates for fabricating an aluminum nitride plate, two were selected out of the laminated bodies after the secondary firing and the commercially-available aluminum nitride monocrystal, both surfaces of which had been polished. Then, bonding surfaces of the selected substrates were cleaned to remove contamination thereon, and the substrates were introduced into a vacuum chamber. Next, the bonding surfaces of the substrates were irradiated with high-speed Ar neutral atom beam (acceleration voltage of 1 kV, Ar flow rate of 60 sccm) in a vacuum on the order of $10^{-6}$ Pa for 70 seconds. After the irradiation, the substrates were let stand for 10 minutes and cooled down to 26 to 28° C. Then, the beam-irradiated surfaces of the laminated body after the secondary firing and the commercially-available aluminum nitride monocrystal were brought into contact with each other, and then these substrates were pressurized under 4.90 kN for 2 minutes to be bonded to each other. After the bonding, the resultant was polished until its surface layer had a thickness of 50 μm and its lower layer had a thickness of 200 μm, and was then annealed at 260° C., to obtain an aluminum nitride plate. FIG. 7 shows combinations of materials (the tape bodies, the aluminum nitride monocrystal) used for aluminum nitride plates (specimens 1 to 6).

The used tapes 1 to 3 in FIG. 7 correspond to the tape bodies obtained from the tape raw materials 1 to 3 in FIG. 6, respectively. In other words, a lower layer of the specimen 1 was the laminated body after the secondary firing originated from the laminated body R1; a lower layer of the specimen 2 was the laminated body after the secondary firing originated from the laminated body R2; an upper layer of the specimen 4 was the laminated body after the secondary firing originated from the laminated body S3; a lower layer of the specimen 4 was the laminated body after the secondary firing originated from the laminated body R1; an upper layer of the specimen 5 was the laminated body after the secondary firing originated from the laminated body S1; a lower layer of the specimen 5 was the laminated body after the secondary firing originated from the laminated body R1; an upper layer of the specimen 6 was the laminated body after the secondary firing originated from the laminated body S2; and a lower layer of the specimen 6 was the laminated body after the secondary firing originated from the laminated body R2. For the specimen 3, a laminated body was not actually fabricated, and the evaluation was made regarding the same aluminum nitride monocrystal as the surface layer or the lower layer. Thus, the specimen 3 was not subjected to the primary firing nor the secondary firing. The surface layer thickness and the lower layer thickness of the specimens can be adjusted freely according to the number of tape bodies to be laminated and/or the polishing after the firing (after the secondary firing) or the bonding.

Degrees of orientation and twist angles of the obtained specimens (specimens 1 to 6) were measured, and the specimens were evaluated in terms of the translucency, film formability, and workability. FIG. 7 shows results of evaluation. The measurement and evaluation methods will hereinafter be described.

The degree of orientation (c-plane degree of orientation) was measured by irradiating measurement surfaces (polished surfaces) of the surface layer and the lower layer of each specimen with X ray. Specifically, XRD profiles were measured in a range of 2θ=20 to 70 degrees, using an XRD device (D8-ADVANCE made by Bruker-AXS) and CuKα ray, under a condition with a voltage of 50 kV and a current of 300 mA. The degree of orientation (f) was calculated by a Lotgering method. Specifically, the degree of orientation (f) was calculated by substituting P, P₀, which were obtained from the following relations (3) and (4), into the relation (2). In the relations, P represents a value obtained from XRD measurement of obtained specimen (aluminum nitride plate), and P₀ represents a value calculated from standard aluminum nitride (JCPDS card No. 076-0566). Further, (100), (002), (101), (102), (110), and (103) were used as (hkl).

$$f = \{(P-P_0)/(I-P_0)\} \times 100 \quad (2)$$

$$P_0 = \Sigma I_0(002)/\Sigma I_0(hkl) \quad (3)$$

$$P = \Sigma I(002)/\Sigma I(hkl) \quad (4)$$

The twist angle (half-value width in the X-ray rocking curve profile) was measured by irradiating (102) planes of the surface layer and the lower layer of each specimen with X ray. Specifically, XRD profiles were measured using an XRD device (D8-DISCOVER made by Bruker-AXS) and CuKα ray, under a condition that a voltage was 40 kV, a current was 40 mA, a collimator diameter was 0.5 mm, an anti-scattering slit was 3 mm, an ω step width was 0.01 degrees, and a counting time was 1 second. Half-value widths were calculated based on the obtained XRC profiles and used as twist angles.

In FIG. 7, for each of the c-plane degree of orientation c1 of the surface layer, the c-plane degree of orientation c2 of the lower layer, the twist angle w1 of the surface layer, and the twist angle w2 of the lower layer, each specimen is marked with "O" if it satisfies the following relations (1) to (4), and marked with "X" if it does not satisfy the relations.

$$c1 > 97.5\% \quad \text{relation 1:}$$

$$c2 > 97.0\% \quad \text{relation 2:}$$

$$w1 < 2.5 \text{ degrees} \quad \text{relation 3:}$$

$$w1/w2 < 0.995 \quad \text{relation 4:}$$

For the transparency (translucency), a piece having a length of 10 mm and a width of 10 mm was cut out from each specimen, and linear transmittance thereof was measured at a wavelength of 450 nm by a spectrophotometer (Lambda 900 made by Perkin Elmer) for evaluation. In FIG. 7, the specimens whose linear transmittance was 40% or more are marked with "O", and the specimens whose linear transmittance was less than 40% are marked with "X".

For the film formability, aluminum gallium nitride ($Al_{0.5}Ga_{0.5}N$) was deposited on a surface of each polished specimen by Metal Organic Chemical Vapor Deposition (MOCVD) and the number of defects on the $Al_{0.5}Ga_{0.5}N$ surface was counted for evaluation. Specifically, a substrate (each specimen) was placed in a reactor and then a raw material was supplied to the substrate under the pressure of 13 kPa in the reactor when the temperature of the substrate (each specimen) was 1000° C., to deposit approximately 230 nm of $Al_{0.5}Ga_{0.5}N$. Ammonia gas, trimethylaluminum, and trimethylgallium were used as the raw material, and hydrogen and nitrogen were used as carrier gas. A deposited surface (surface of the $Al_{0.5}Ga_{0.5}N$ layer) was then observed under a scanning electron microscope (JSM-6390 made by JEOL Ltd.) at a magnification of 3000 (20 fields or more) and the number of defects such as cracks, pinholes, and the like was counted to evaluate whether or not the number of defects was 100/mm² or less. In FIG. 7, the specimens whose number of defects was 100/mm² or less are marked with "O", and the specimens whose number of defects exceeded 100/mm² are marked with "X".

For the workability, each specimen was diced and a chipping width in the rear surface thereof after the dicing was measured for evaluation. Specifically, a sintered alumina plate with a flat surface was prepared, and lower layer sides of the specimens were fixed to the surface (the flat surface) of the sintered alumina plate with wax. The specimens were then cut from their surface layer sides by a resin diamond blade of #400, at a blade rotating speed of 30000 rpm and a blade feeding speed of 3 mm/s. After the cutting, the specimens were removed from the sintered alumina plate, their lower layer sides were observed under an optical microscope to measure chipping widths in the rear surfaces (widths of chipping from the cutting surfaces located in the lower layer surfaces), and whether or not the chipping widths were 10 μm or less was evaluated. In FIG. 7, the specimens whose chipping widths in the rear surfaces were 10 μm or less are marked with "O", and the specimens whose chipping widths in the rear surfaces exceeded 10 μm are marked with "X".

As shown in FIG. 7, it was confirmed that the specimens (specimens 1, 3, 4, 5), in which the surface layer and the lower layer have high c-plane degrees of orientation (satisfy the relations 1 and 2), had high translucency. Moreover, it was confirmed that the specimens (specimens 1, 2, 3), in which the surface layer has a high c-plane degree of orientation (satisfies the relation 1) and has a small twist angle (satisfies the relation 3), had good film formability. It was confirmed that out of the specimens (specimens 1, 2, 3) having good film formability, the specimens (specimens 1, 2), in which the lower layer has a larger twist angle than the surface layer (satisfies the relation 4), had good workability. In other words, it was confirmed that an aluminum nitride plate that has high strength (high fracture toughness) and enables growth of a good-quality (less-defective) semiconductor can be obtained with the relations 1, 3, and 4 satisfied. Moreover, it was confirmed that an aluminum nitride plate that has high strength and high translucency and enables growth of a good-quality (less-defective) semiconductor can be obtained with all of the relations 1 to 4 satisfied.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

The invention claimed is:
1. An aluminum nitride plate, wherein the aluminum nitride plate satisfies following relations (1) to (4)

$$c1 > 97.5\%, \quad (1):$$

$$c2 > 97.0\%, \quad (2):$$

$$w1 < 2.5 \text{ degrees}, \quad (3):$$

$$w1/w2 < 0.996 \quad (4):$$

where c1 is a c-plane degree of orientation that is defined as a ratio of a diffraction intensity of (002) plane to a sum of the diffraction intensity of (002) plane and a diffraction intensity of (100) plane when a surface layer of the aluminum nitride plate is subjected to an X-ray diffraction measurement along a thickness direction of the surface layer, and c2 is a c-plane degree of orientation that is defined as a ratio of the diffraction intensity of (002) plane to the sum of the diffraction intensity of (002) plane and the diffraction intensity of (100) plane when a portion other than the surface layer of the aluminum nitride plate is subjected to the X-ray diffraction measurement along a thickness direction of the portion other than the surface layer, wherein w1 is a half-value width in an X-ray rocking curve profile of (102) plane of the surface layer of the aluminum nitride plate and w2 is a half-value width in the X-ray rocking curve profile of (102) plane of the portion other than the surface layer of the aluminum nitride plate.

2. The aluminum nitride plate according to claim 1, wherein
a difference in nitrogen content between the surface layer of the aluminum nitride plate and the portion other than the surface layer is less than 0.15% in weight ratio.

* * * * *